US012777819B2

(12) United States Patent
Takahashi

(10) Patent No.: US 12,777,819 B2
(45) Date of Patent: Oct. 27, 2026

(54) DISPLAY DEVICE

(71) Applicant: Magnolia White Corporation, Tokyo (JP)

(72) Inventor: Hideyuki Takahashi, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 427 days.

(21) Appl. No.: 18/462,436

(22) Filed: Sep. 7, 2023

(65) Prior Publication Data

US 2023/0422550 A1 Dec. 28, 2023

Related U.S. Application Data

(63) Continuation of application No. PCT/JP2022/000966, filed on Jan. 13, 2022.

(30) Foreign Application Priority Data

Mar. 9, 2021 (JP) ................................ 2021-037462

(51) Int. Cl.

*H10K 59/80* (2023.01)
*G09F 9/30* (2006.01)
(Continued)

(52) U.S. Cl.

CPC ....... *H10K 59/873* (2023.02); *H10K 59/1201* (2023.02); *H10K 59/124* (2023.02);
(Continued)

(58) Field of Classification Search

CPC ............... H10K 59/873; H10K 59/124; H10K 59/8731; H10K 59/8051; H10K 59/8052;
(Continued)

(56) References Cited

U.S. PATENT DOCUMENTS

2009/0009069 A1 1/2009 Takata
2012/0228603 A1 9/2012 Nakamura
(Continued)

FOREIGN PATENT DOCUMENTS

JP 2009-032673 A 2/2009
JP 2014-103424 A 6/2014
(Continued)

OTHER PUBLICATIONS

International Search Report and Written Opinion mailed on Mar. 8, 2022, received for PCT Application PCT/JP2022/000966, filed on Jan. 13, 2022, 10 pages including English Translation.
(Continued)

*Primary Examiner* — Sonya McCall-Shepard
(74) *Attorney, Agent, or Firm* — XSENSUS LLP

(57) ABSTRACT

According to one embodiment, a display device includes a first insulating member disposed surrounding a display area, a second insulating member disposed to be spaced apart from the first insulating member and surrounding the first insulating member, an auxiliary member disposed on the second insulating member and an sealing layer. The sealing layer includes a first inorganic sealing layer disposed in a region surrounded by the second insulating member, a first organic sealing layer disposed in a region surrounded by the first insulating member, a second inorganic sealing layer disposed in an region surrounded by the second insulating member and a second organic sealing layer which covers the second inorganic sealing layer.

6 Claims, 4 Drawing Sheets

(51) Int. Cl.

| | |
|---|---|
| ***H05B 33/02*** | (2006.01) |
| ***H05B 33/04*** | (2006.01) |
| ***H05B 33/12*** | (2006.01) |
| ***H05B 33/22*** | (2006.01) |
| ***H10K 59/12*** | (2023.01) |
| ***H10K 59/122*** | (2023.01) |
| ***H10K 59/124*** | (2023.01) |
| ***H10K 59/82*** | (2023.01) |

(52) U.S. Cl.
CPC ..... *H10K 59/8051* (2023.02); *H10K 59/8052* (2023.02); *H10K 59/80522* (2023.02); *H10K 59/82* (2023.02); *H10K 59/871* (2023.02); *H10K 59/8731* (2023.02)

(58) Field of Classification Search
CPC ............ H10K 59/80522; H10K 59/82; H10K 59/871; H10K 59/122; H05B 33/04; H05B 33/22
See application file for complete search history.

(56) References Cited

U.S. PATENT DOCUMENTS

| | | | | |
|---|---|---|---|---|
| 2015/0091030 | A1 | 4/2015 | Lee et al. | |
| 2017/0345881 | A1 | 11/2017 | Kim et al. | |
| 2018/0226454 | A1* | 8/2018 | Liu ..................... | H10K 59/122 |
| 2019/0341576 | A1 | 11/2019 | Ochi et al. | |
| 2019/0348476 | A1* | 11/2019 | Kato .................... | G06F 3/0443 |
| 2020/0266352 | A1 | 8/2020 | Kubota | |
| 2021/0028388 | A1 | 1/2021 | Jiang | |

FOREIGN PATENT DOCUMENTS

| | | | |
|---|---|---|---|
| JP | 2020-134715 | A | 8/2020 |
| WO | 2018/061195 | A1 | 4/2018 |

OTHER PUBLICATIONS

Japanese Office Action issued Aug. 26, 2025, in corresponding Japanese Patent Application No. 2023-505151, 10pp.

* cited by examiner

DISPLAY DEVICE

CROSS-REFERENCE TO RELATED APPLICATIONS

This application is a Continuation Application of PCT Application No. PCT/JP2022/000966, filed Jan. 13, 2022 and based upon and claiming the benefit of priority from Japanese Patent Application No. 2021-037462, filed Mar. 9, 2021, the entire contents of all of which are incorporated herein by reference.

FIELD

Embodiments described herein relate generally to a display device.

BACKGROUND

In recent years, display devices in which an organic light-emitting diode (OLED) is that applied as a display element have been put to practical use.

In such a display device, a sealing layer is formed to prevent moisture that has entered from the outside from reaching the display element described above.

However, if the sealing layer is not formed properly, a path may be formed for moisture to enter the display element.

DETAILED DESCRIPTION

Figure 1:
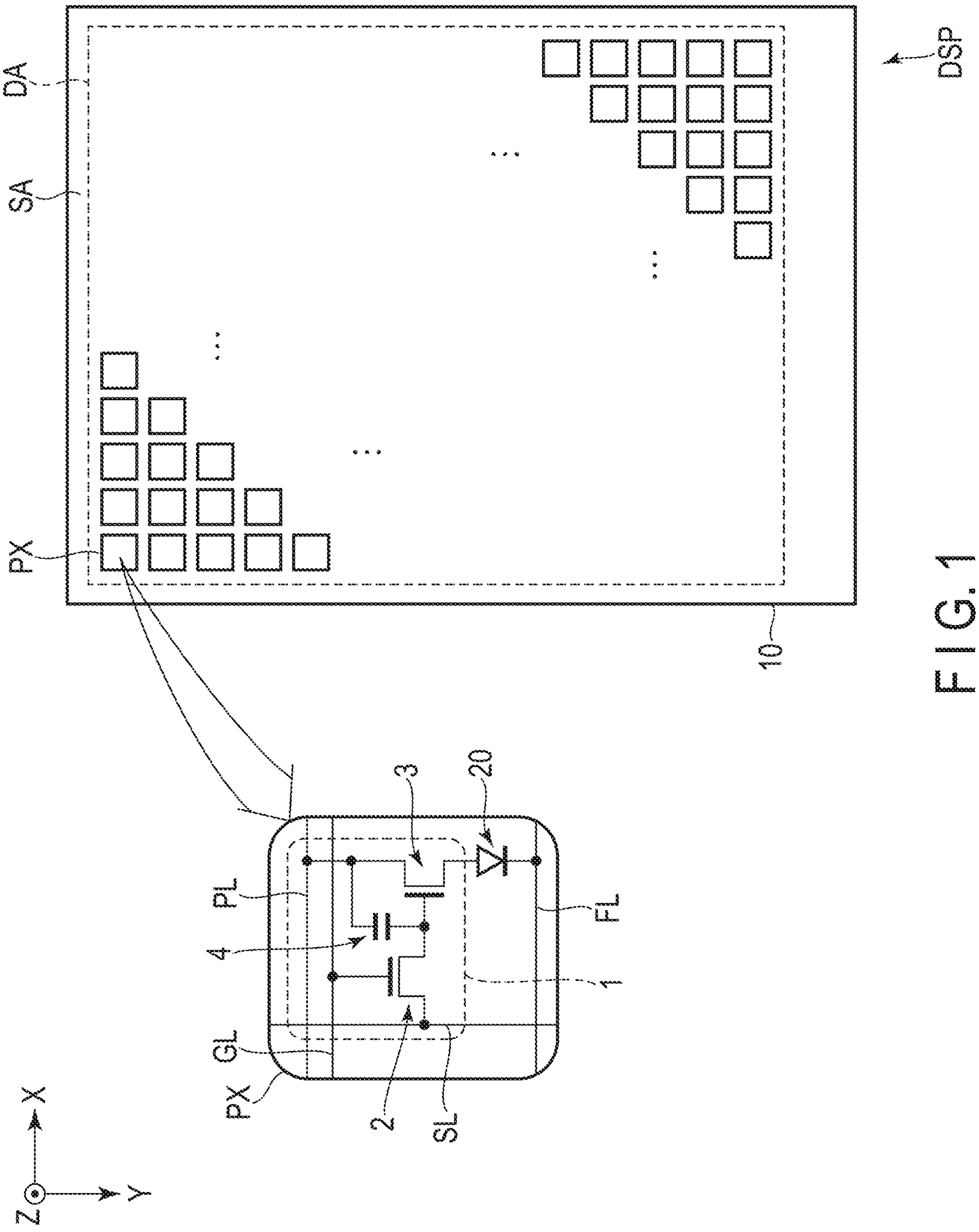
FIG. 1 is a diagram showing a configuration example of a display device according to an embodiment.

In general, according to one embodiment, a display device includes a base, a first insulating layer disposed on the base, a display element disposed on the first insulating layer for each pixel provided in a display area, a second insulating layer disposed on the first insulating layer and including an opening portion which overlaps the display element, a first insulating member disposed in a peripheral area on an outer side of the display area and surrounding the display area, a second insulating member disposed in the peripheral area so as to be spaced apart from the first insulating member and surrounding the first insulating member, an auxiliary member disposed on the second insulating member and an sealing layer which covers the display element. The sealing layer includes a first inorganic sealing layer disposed in a region surrounded by the second insulating member, a first organic sealing layer disposed on the first inorganic sealing layer in a region surrounded by the first insulating member, a second inorganic sealing layer disposed in an region surrounded by the second insulating member and sealing the first organic sealing layer together with the first inorganic sealing layer and a second organic sealing layer which covers the second inorganic sealing layer in a region surrounded by the second insulating member.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as a first direction, a direction along the Y axis is referred to as a second direction and a direction along the Z axis is referred to as a third direction. In the embodiments, viewing toward an X-Y plane defined by the first direction X and the second direction Y is referred to as plan view. Further, here, the third direction Z is defined as up or above, and the direction opposite to the third direction Z is defined as down or below. With such expressions as "the second member above the first member" and "the second member below the first member", the second member may be in contact with the first member or may be located away from the first member.

A display device DSP in this embodiment is an organic electroluminescent display device including an organic light-emitting diode (OLED) as a display element, and can be mounted on televisions, personal computers, mobile terminals, mobile cell phones and the like.

FIG. 1 shows a configuration example of the display device DSP in this embodiment. The display device DSP includes a display area DA which displays images and a surrounding area SA on an outer side of the display area DA on an insulating base 10. The base may be glass or a flexible resin film.

The display area DA includes a plurality of pixels PX arranged in a matrix along the first direction X and the second direction Y.

A configuration example of the pixels PX will now be briefly explained. The pixels PX each includes a pixel circuit 1 and a display element 20 driven by the pixel circuit 1. The pixel circuit 1 includes a pixel switch 2, a drive transistor 3 and a capacitor 4. The pixel switch 2 and the drive transistor 3 are switching elements constituted by thin-film transistors, for example.

A gate electrode of the pixel switch 2 is connected to a scanning line GL, a source electrode thereof is connected to a signal line SL, and a drain electrode is connected to one of electrodes which constitutes a capacitor 4 and a gate electrode of the drive transistor 3. A source electrode of the drive transistor 3 is connected to the other electrode which constitutes the capacitor 4 and a power line PL, and a drain electrode thereof is connected to an anode of the display element 20. A cathode of the display element is connected to a power feed line FL. Note that the configuration of the pixel circuit 1 is not limited to that of the example shown in the figure.

The display element 20 is an organic light emitting diode (OLED), which is a light emitting element. In this embodiment, it is assumed that each of the plurality of pixels PX includes a display element 20 that emits light corresponding to the same wavelength, for example. In this case, it is assumed that the display element 20 is configured to emit white light, for example. The configuration of the display element 20 will be described later.

Figure 2:
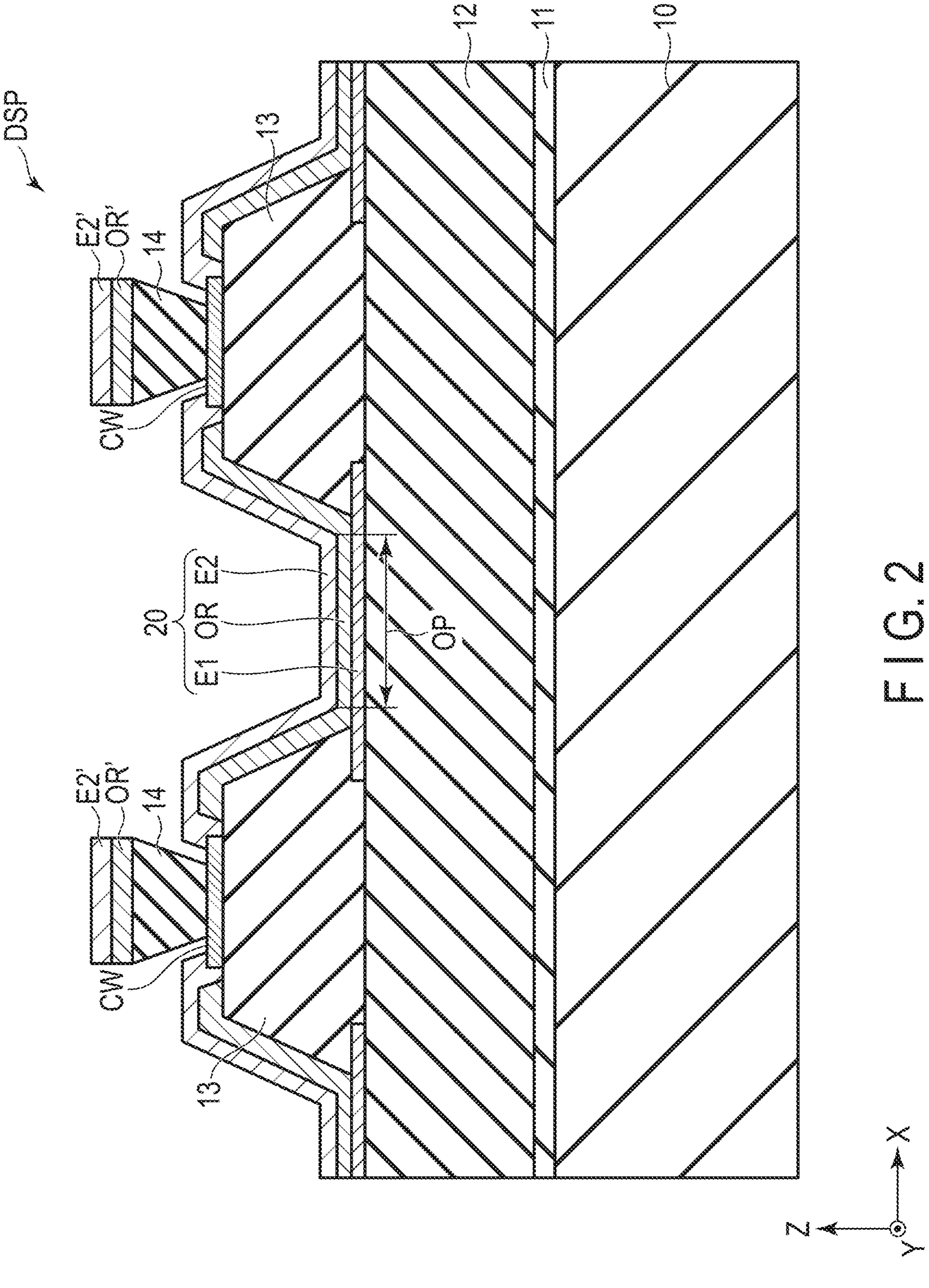
FIG. 2 is a diagram showing an example of a cross section of a display area of the display device.

FIG. 2 shows an example of a cross-section of the display area DA of the display device DSP according to this embodiment. Here, the configuration of the display element 20 provided in one pixel PX will be mainly described.

An undercoat layer 11 is placed on the base described above. The undercoat layer 11 includes, for example, a silicon nitride layer. The silicon nitride layer has a function of preventing moisture or impurities from entering from the outside (a base 10 side).

The insulating layer 12 is disposed on the undercoat layer 11. The pixel circuit 1 shown in FIG. 1 is placed on the undercoat layer 11 and covered by the insulating layer 12, but is omitted from the illustration of FIG. 2. The insulating layer 12 corresponds to an underlayer of the display element 20 and is, for example, an organic insulating layer formed of an organic material.

The insulating layer 13 is disposed on the insulating layer 12. The insulating layer 13 is, for example, an organic insulating layer formed of an organic material. The insulating layer 13 is formed to compartmentalize display elements 20 or pixels PX including the display elements 20 from each other, and may be referred to as ribs, for example.

The display element 20 is disposed on the insulating layer 12 for each of the pixels PX provided in the display area DA, and includes a first electrode E1, an organic layer OR and a second electrode E2. The first electrode E1 is an electrode provided for each display element 20 or each pixel PX and may be referred to as a pixel electrode, a lower electrode, an anode or the like. The second electrode E2 is an electrode for applying a common voltage to a plurality of pixels PX, and may be referred to as a common electrode, a counter electrode, an upper electrode, a cathode or the like.

The first electrode E1 is disposed on the insulating layer 12 and its peripheral portion is covered by the insulating layer 13. The first electrode E1 is electrically connected to the drive transistor 3 shown in FIG. 1. The first electrode E1 is a transparent electrode formed of, for example, a transparent conductive material such as indium tin oxide (ITO) or indium zinc oxide (IZO). The first electrode E1 may be a metal electrode formed of a metal material such as silver or aluminum. Further, the first electrode E1 may be a stacked body of a transparent electrode and a metal electrode. Furthermore, the first electrode E1 may be configured as a stacked body in which a transparent electrode, a metal electrode and a transparent electrode are stacked in this order, or as a stacked body of three or more layers.

Here, the insulating layer 13 includes an opening OP which overlap the first electrode E1 in each pixel PX. In this case, the organic layer OR is disposed on the insulating layer 13 and is in contact with the first electrode E1 through the opening OP.

The second electrode E2 is disposed on the organic layer OR so as to cover the organic layer OR. The second electrode E2 is, for example, a transparent electrode formed of a transparent conductive material such as ITO or IZO. Note that the second electrode E2 may be covered by a transparent protective film (which includes at least one of an inorganic insulating film and an organic insulating film).

Here, in the display device DSP, a partition 14 is disposed at a position corresponding to a boundary between each adjacent pair of pixels PX. The partition 14 has an inverse tapered shape. The term "inverse tapered shape" means such a shape that the width of the upper portion is larger than the width of the lower portion (bottom portion) such as of the partition shown in FIG. 2. Side surfaces of the partition 14 may be flat or curved surfaces, inclined with respect to the third direction Z. Further, the partition 14 may be composed of a plurality of portions whose width decreases in steps from the upper portion to the lower portion.

Moreover, the partition 14 overlaps the insulating layer 13 in plan view and is formed to compartmentalize the pixels PX from each other. The organic layer OR described above is formed, for example, by an anisotropic or directional vacuum evaporation method. Here, when the organic material to form the organic layer OR is evaporated over the entire display area DA, for example, while the partition 14 is disposed in place, the organic layer OR is not substantially formed on the side surfaces of the partition 14 because the partition 14 has a reverse tapered shape. With this configuration, the organic layer OR is formed so as to be in contact with the first electrode E1 through the opening OP described above and also in contact with the insulating layer 12 between the opening OP and the partition 14. In other words, the organic layer OR can be formed such that it is divided by the partition 14 into a plurality for each pixel PX.

Further, the second electrode E2 is formed by a vacuum evaporation method that is less directional than that of the vacuum evaporation used for the organic layer OR, or an isotropic vacuum evaporation. In this case, the second electrode E2 can be formed to cover the organic layer OR.

In other words, according to the configuration with the partition 14 formed to compartmentalize the pixels PX, the organic layer OR and the second electrode E2 are formed in the compartmentalized regions each surrounded by the partition 14 in plan view (that is, in the area overlapping the pixel PX).

Note that when the organic layer OR and the second electrode E2 are formed as described above, an organic layer OR' and a second electrode E2', which are separated from the organic layer OR and the second electrode E2 are formed on the upper surface of the partition 14.

Incidentally, the second electrode E2 is an electrode for applying a common voltage to the above-described plurality of pixels PX, but the second electrode E2 is formed to be compartmentalized for each pixel PX. For this reason, in the display device DSP, for example, the second electrode E2 formed in the region overlapping on the pixel PX and the second electrode E2 formed in the region overlapping a pixel PX adjacent to the pixel PX are assumed to be connected to each other via an auxiliary wiring line (cathode wiring line) CW. The auxiliary wiring CW is formed of a metal material and placed on the insulating layer 13. In this case, the above-described partition 14 is disposed on the auxiliary wiring CW. Note that the plurality of second electrodes E2, which are connected to each other via the auxiliary wiring CW, are electrically connected to, for example, a power feed line FL disposed in the peripheral area SA.

Figure 3:
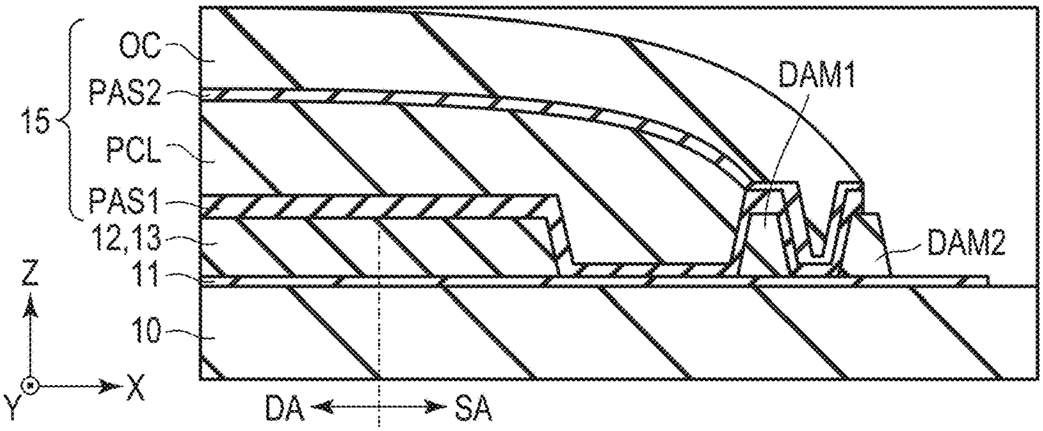
FIG. 3 is a diagram illustrating a sealing layer formed in a display device according to a comparative example of this embodiment.

Here, in the display device DSP as shown in FIG. 2, a sealing layer is formed to cover the pixel PX (display element 20). Now, with reference to FIG. 3, a sealing layer formed in a display device according to a comparative example of this embodiment will be explained. FIG. 3 schematically shows an example of a cross-section of a boundary portion between the display area DA and the peripheral area SA of the display device according to the comparative example of the present embodiment. Note that in FIG. 3, for convenience, the insulating layers 12 and 13 described with reference to FIG. 2 are represented as a single layer, and the partition 14, the display element 20 and the like are omitted from illustration.

As shown in FIG. 3, the sealing layer 15 is formed to block, for example, external moisture and the like from entering the display element 20 from an opposite side to the base 10 (that is, in the third direction Z), and is constituted by a plurality of multiple layers.

Specifically, the sealing layer 15 has a structure in which, for example, a first inorganic sealing layer PAS1, a first organic sealing layer PCL, a second inorganic sealing layer PAS2 and a second organic sealing layer OC are stacked in order from a display element 20 side.

The first inorganic sealing layer PAS1 is disposed at a position overlapping the display area DA and a part of the peripheral area so as to cover at least the display element 20. The inorganic sealing layer PAS1 is formed of silicon nitride, for example, to prevent moisture from penetrating into the display element 20.

The first organic sealing layer PCL is disposed on the first inorganic sealing layer PAS1. The first organic sealing layer PCL is formed of, for example, acrylic resin, epoxy resin, polyimide resin, silicon resin, fluorine resin, siloxane resin or the like.

The second inorganic sealing layer PAS2 is disposed to cover the first organic sealing layer PCL. As in the case of the first inorganic sealing layer PAS1 described above, the second inorganic sealing layer PAS2 is formed of, for example, silicon nitride to prevent moisture from entering the display element 20.

The second organic sealing layer OC corresponds to an overcoat layer and is disposed to cover the second inorganic sealing layer PAS2. The second organic sealing layer OC is formed of, for example, acrylic resin, rubber-based resin, silicon-based resin, or urethane resin.

Here, as explained above with reference to FIG. 2, the display element 20 is disposed above the insulating layer 12 and in a position overlapping the opening OP of the insulating layer 13, and therefore the insulating layers 12 and 13 are disposed over the entire display area DA, but as shown in FIG. 3, the peripheral portions of the insulating layers 12 and 13 are located in the peripheral area SA.

In this case, in the display device according to the comparative example of the present embodiment, a first insulating member DAM1 is disposed at a position remote from the peripheral portion of the insulating layer 12 on the peripheral area SA. The first insulating member DAM1 has a convex shape and is formed to surround the display area DA (the insulating layers 12 and 13) so as to function as a dam.

Further, in the display device according to the comparative example of the present embodiment, a second insulating member DAM2 is further disposed at a position remote from the first insulating member DAM1 on the peripheral area SA. The second insulating member DAM2 has a convex shape as in the case of the first insulating member DAM1 and is formed to surround the first insulating member DAM1 so as to function as a dam.

Note that the first insulating member DAM1 and the second insulating member DAM2 are formed of the same material on the same layer as those of the insulating layers 12 and 13, for example, and can be formed by the same process as that of the insulating layers 12 and 13.

The following is a brief description of the process of forming the sealing layer 15 in the display device according to the comparative example of the present embodiment.

First, the first inorganic sealing layer PAS1 is formed. The first inorganic sealing layer PAS1 is formed to cover the display element 20 and the like, in the display area DA and to cover the insulating layers 12 and 13, the undercoat layer 11, the first insulating member DAM1 and the second insulating member DAM2 in the peripheral area SA.

Next, on the first inorganic sealing layer PAS1, the first organic sealing layer PCL is formed. Note that the first organic sealing layer PCL is formed using, for example, an ink-jet method, so as to interrupt by the first insulating member DAM1. In other words, with the first insulating member DAM1 thus disposed, the first organic sealing layer PCL is placed (formed) on the first inorganic sealing layer PAS1 in the region surrounded by the first insulating member DAM1 (the region on an inner side with respect to the first insulating member DAM1).

Further, a second inorganic sealing layer PAS2 is formed on the first organic sealing layer PCL. As described above, the first organic sealing layer PCL is interrupted by the first insulating member DAM1, and therefore the second inorganic sealing layer PAS2 is formed on the first inorganic sealing layer PAS1 which covers the first organic sealing layer PCL and is formed on an outer side of the first organic sealing layer PCL (an opposite side to the display area DA).

As shown in FIG. 3, between the first insulating member DAM1 and the second insulating member DAM2 disposed to be separated from each other, there is a region where the undercoat layer 11 (silicon nitride layer), the first inorganic sealing layer PAS1 and the second inorganic sealing layer PAS2 overlap each other, and the region functions as a moisture barrier region. With this configuration, since the first organic sealing layer PCL is sealed by the first inorganic sealing layer PAS1 and the second inorganic sealing layer PAS2, it is possible to prevent moisture and the like from the outside from reaching the display element 20 through the first organic sealing layer PCL.

Next, the second organic sealing layer OC is formed on the second inorganic sealing layer PAS2. Note that the second organic sealing layer OC is formed, for example, using an ink-jet method so as to interrupt by the second insulating material DAM2.

Note that the second organic sealing layer OC functions as a mask for the first inorganic sealing layer PAS1 and the second inorganic sealing layer PAS2, which are formed on an outer side of the second insulating member DAM2 (opposite side to the display area DA). That is, the first inorganic sealing layer PAS1 and the second inorganic sealing layer PAS2 formed on an outer side (opposite side to the display area DA) of the second insulating member DAM2 in the process of forming the sealing layer 15 as described above, are removed by etching with use of the second organic sealing layer OC as a mask. In this case, the side (end) surface of the second organic sealing layer OC overlap the side (end) surfaces of the first inorganic sealing layer PAS1 and the second inorganic sealing layer PAS2 in plan view.

Here, in FIG. 3 described above, the comparative example of this embodiment is described on the assumption that the second insulating member DAM2, which functions as a dam, interrupts the second organic sealing layer OC to form the second organic sealing layer OC that functions as a mask for the first inorganic sealing layer PAS1 and the second inorganic sealing layer PAS2. But there is a possibility that the second organic sealing layer OC may overflow past the second insulating member DAM2, for example, to the end portion of the peripheral area SA.

When the second organic sealing layer OC overflowing to the end portion of the peripheral area SA is used as a mask, the first inorganic sealing layer PAS1 and the second inorganic sealing layer PAS2 cannot be properly removed, and the first inorganic sealing layer PAS1 and the second inorganic sealing layer PAS2 remain to the end portion of the peripheral area SA.

Generally, in the manufacturing process for the display device DSP, a plurality of display panels used for manufacturing a plurality of display devices are formed on a mother base from which a plurality of bases 10 are formed as a butch, and each of the plurality of display panels is cut out (hereinafter referred to as panel cutting).

During such panel cutting, if the first inorganic sealing layer PAS1 and the second inorganic sealing layer PAS2 remain to the end portion of the peripheral area SA as described above, cracks may occur in the first inorganic sealing layer PAS1 or the second inorganic sealing layer PAS2, and due to the cracks, for example, moisture penetration path (path) may be formed in the display element 20.

Figure 4:
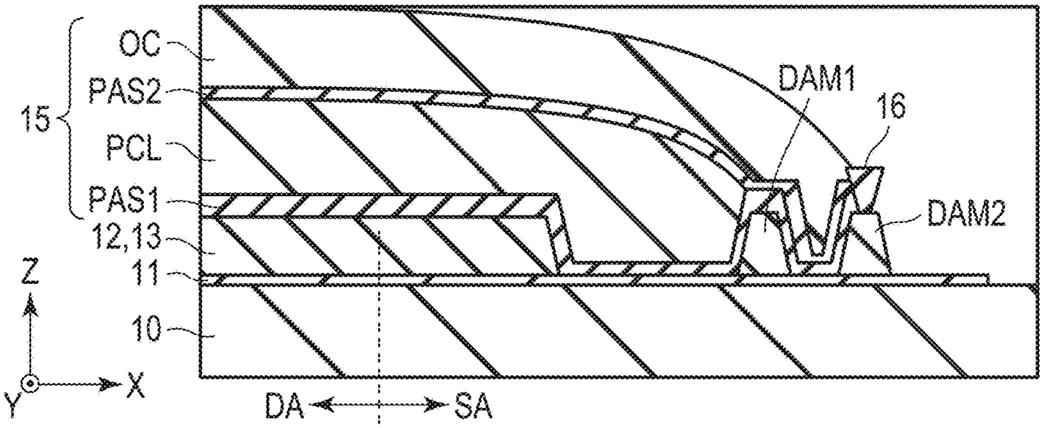
FIG. 4 is a diagram illustrating an auxiliary member placed over a second insulating member in the display device of this embodiment.

As measures to this, in the display device DSP according to this embodiment, as shown in FIG. 4, an auxiliary member 16 is further disposed on the second insulating member DAM2. The auxiliary member 16 has the role of preventing the second organic sealing layer OC from overflowing the second insulating member DAM2 to flow out of the second insulating member DAM2 when forming the second organic sealing layer OC.

With such an auxiliary member 16 thus formed, the second organic sealing layer OC can be appropriately formed to cover the second inorganic sealing layer PAS2 in the region surrounded by the second insulating member DAM2 (the region on an inner side with respect to the second insulating member DAM2).

In this embodiment, the auxiliary member 16 is formed, for example, in the same layer and of the same material as those of the partition 14 described above, and can be formed by the same process as that used to form the partition 14. In this case, the auxiliary member 16 has an inverse tapered shape as in the case of the partition 14 described above.

Figure 5:
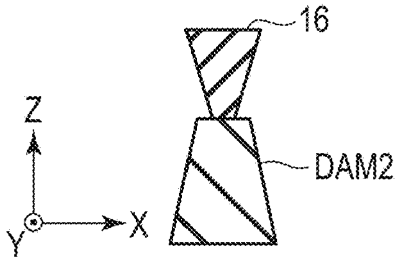
FIG. 5 is a diagram showing an example of a location where the auxiliary member is disposed.

Note that it suffices if the auxiliary member 16 is formed in the center of the upper surface of the second insulating member DAM2, which is formed into a convex shape as shown in FIG. 5, for example, but it can as well be formed on an inner side with respect to the center of the second insulating member DAM2 (on a display area DA side) or an outer side with respect to the center of the second insulating member DAM2 (on the opposite side to the display area DA).

As described above, in this embodiment, the auxiliary member 16 is further disposed on the second insulating member DAM2 that functions as a dam to interrupt the second organic sealing layer OC when forming the sealing layer 15. With this structure, it is possible to improve the dam effect with respect to the second organic sealing layer OC and thus, the sealing layer 15 (the second organic sealing layer OC) can be appropriately formed.

That is, in this embodiment, it is possible to prevent the second organic sealing layer OC from overflowing the second insulating member DAM2 to flow out to the end portion of the peripheral area SA (in other words, to prevent the first inorganic sealing layer PAS1 and the second inorganic sealing layer PAS2, which are removed by etching using the second organic sealing layer OC as a mask, from remaining to the end portion of the peripheral area SA). Therefore, cracks can be avoided, which may occur by panel cutting, in the first inorganic sealing layer PAS1 and the second inorganic sealing layer PAS2, thus forming a moisture penetration path to the display element 20.

Further, this embodiment is described in connection with the case where the auxiliary member 16 is formed on the same layer and of the same material as those of the partition 14. With such a structure, the auxiliary member 16 ca be formed in the same process as that of the partition 14, thus making it possible to simplify the process of forming the auxiliary member 16.

Moreover, since the partition 14 is disposed to compartmentalize the pixels PX from each other in this embodiment, the organic layer OR can be separated for each pixel PX, for example. With this structure, leakage current (lateral leakage) between organic layers OR provided in each adjacent pair of pixels PX can be suppressed. Further, this embodiment has such a configuration that the organic layers OR are separated from each other by the partition 14, and therefore there is no need to use a fine mask or the like to separate the organic layers OR from each other.

Further, in this embodiment, for example, the second electrode E2 disposed in a position overlapping the respective pixel PX (first pixel) is connected to the second electrode disposed in a position overlapping another pixel PX adjacent to the respective pixel PX, via an auxiliary wiring line disposed between the insulating layer 13 and the partition 14. According to the above-described configuration, which is even that in which the partition 14 is disposed to compartmentalize the pixels PX from each other, a common voltage can be applied to each of the pixels PX via the respective second electrode E2.

Note that this embodiment is described on the assumption that the auxiliary member 16 is formed in the same process as that of the partition 14 to form the auxiliary member 16 in an inverse tapered shape similar to that of the partition 14 (the width of the upper portion is larger than that of the lower part). However, as long as the dam effect in the second insulating member DAM2 can be improved as described above, the auxiliary member 16 may be formed into a different shape by a different process from those of the partition 14. It should be noted here that the auxiliary member 16 should be shaped to have a predetermined height (length along the third direction Z) to improve the dam effect on the second organic sealing layer OC.

Further, in this embodiment, since the first insulating member DAM1, which functions as a dam to interrupt the first organic sealing layer PCL, is provided, it may be considered to disposed the auxiliary member 16 on the first insulating member DAM1 as well. But disposing the auxiliary member 16 on the first insulating member DAM1 may cause cracking. For this reason, it is assumed that the auxiliary member 16 in this embodiment is placed at least on an outer side of the moisture blocking area described above (on the opposite side to the display area DA).

Furthermore, this embodiment is described on the assumption that there are only one first insulating member DAM1 and only one second insulating member DAM2, but a plurality of first insulating members DAM1 and a plurality of second insulating members DAM2 may be provided. In this case, the auxiliary member 16 may be disposed, for example, only on the second insulating member DAM2 located at the outermost position (that is, the farthest one from the display area DA) of the plurality of second insulating members DAM2, or may be disposed on two or more second insulating members DAM2.

Note that this embodiment is described on the assumption that each of the plurality of pixels PX includes a display element 20 that emits, for example, white light. In the case of such a configuration, the display device DSP includes, for example, color filters colored in red, green and blue provided at positions opposite to the display elements 20 (opposite to the base 10), respectively. In this configuration, for example, the display device DSP can emit red, green and blue light from the respective pixels PX, thus enabling multicolor display.

In the meantime, when the display element 20 emits ultraviolet light (that is, the emission color is ultraviolet light), light conversion layers are provided at position opposite to the respective display elements 20, and therefore multicolor display can be realized.

Further, this embodiment may be configured such that each of the plurality of pixels PX includes a plurality of subpixels displaying different colors. For example, each pixel PX includes a subpixel SP1 that displays red, a subpixel SP2 that displays green and a subpixel SP3 that displays blue. In this case, the subpixel SP1 may as well be configured to display red (that is, emit red light) using a color filter or light conversion layer such as that described above, or may be configured to display red using a display element including an organic layer that emits red light. Here, only the subpixel SP1 is described, but this is also the case for the subpixels SP2 and SP3 as well.

Figure 6:
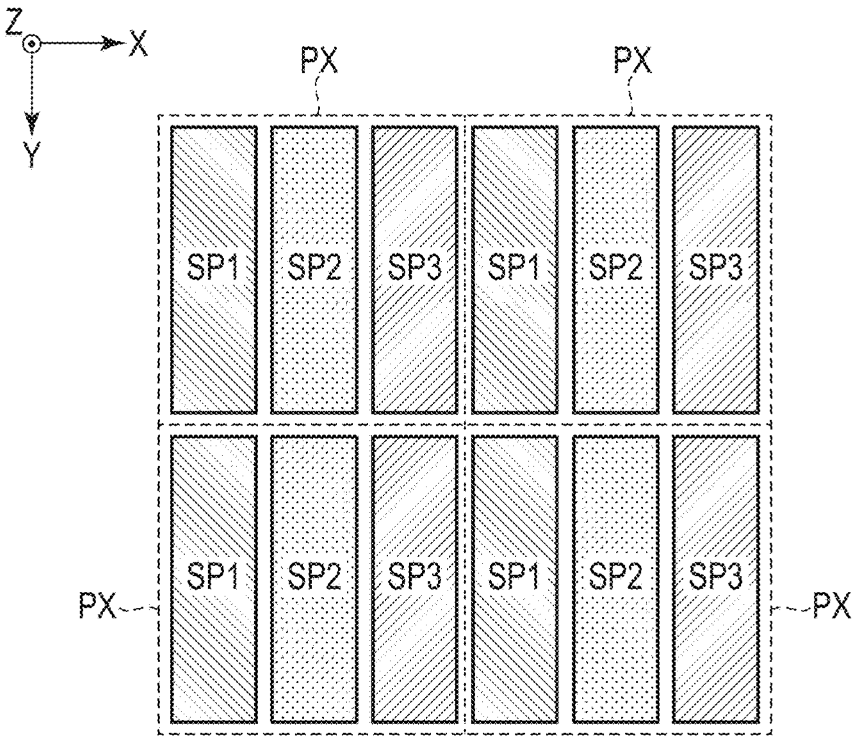
FIG. 6 is a diagram showing an example of an arrangement of subpixels provided in a pixel.
Figure 7:
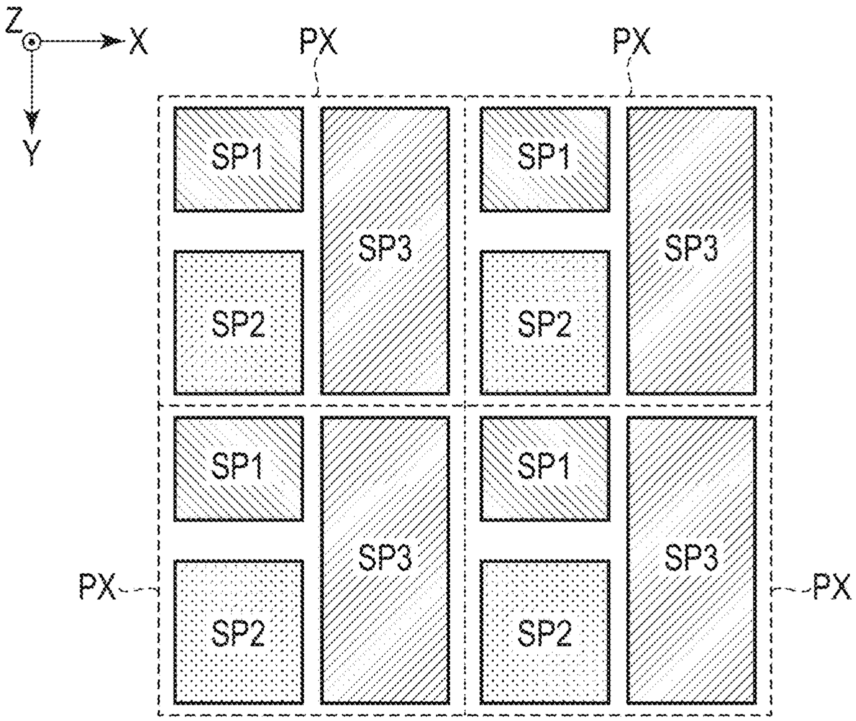
FIG. 7 is a diagram showing another example of the arrangement of the subpixels provided in the pixel.

Note that the subpixels SP1, SP2 and SP3 (which are provided in pixels PX) can be disposed as shown in FIG. 6 or FIG. 7, for example. The outer shapes of the subpixels SP1, SP2 and SP3 shown in FIGS. 6 and 7 respectively correspond, for example, to the outer shapes of the light-emitting regions of the display elements 20 (the regions of the openings OP which respectively overlap the first electrode E1, the organic layer OR and the second electrode E2), but FIGS. 6 and 7 are simplified to merely illustrate the arrangement (layout) of the subpixels SP1, SP2 and SP3. Note that the illustration may not necessarily reflect the actual shape.

Here, the descriptions are provided on the assumption that the pixels PX each includes subpixels SP1, SP2 and SP3, but the pixels PX may include four or more subpixels.

All display devices, which are implementable with arbitrary changes in design by a person of ordinary skill in the art based on the display devices described above as the embodiments of the present invention, belong to the scope of the present invention as long as they encompass the spirit of the present invention.

Various modifications are easily conceivable within the category of the idea of the present invention by a person of ordinary skill in the art, and these modifications are also considered to belong to the scope of the present invention. For example, additions, deletions or changes in design of the constituent elements or additions, omissions or changes in condition of the processes may be arbitrarily made to the above embodiments by a person of ordinary skill in the art, and these modifications also fall within the scope of the present invention as long as they encompass the spirit of the present invention.

In addition, the other advantages of the aspects described in the above embodiments, which are obvious from the descriptions of the specification or which are arbitrarily conceivable by a person of ordinary skill in the art, are considered to be achievable by the present invention as a matter of course.

What is claimed is:

1. A display device comprising:

a base;

a first insulating layer disposed on the base;

a display element disposed on the first insulating layer for each pixel provided in a display area;

a second insulating layer disposed on the first insulating layer and including an opening portion which overlaps the display element;

a partition disposed on the second insulating layer so as to divide pixels from each other;

a first insulating member disposed in a peripheral area on an outer side of the display area and surrounding the display area;

a second insulating member disposed in the peripheral area so as to be spaced apart from the first insulating member and surrounding the first insulating member;

an auxiliary member disposed on the second insulating member; and a sealing layer which covers the display element, the sealing layer including:

a first inorganic sealing layer disposed in a region surrounded by the second insulating member;

a first organic sealing layer disposed on the first inorganic sealing layer in a region surrounded by the first insulating member;

a second inorganic sealing layer disposed in a region surrounded by the second insulating member and sealing the first organic sealing layer together with the first inorganic sealing layer; and a second organic sealing layer which covers the second inorganic sealing layer in a region surrounded by the second insulating member, wherein a first distance from the base to an upper surface of the auxiliary member is greater than a second distance from the base to an upper surface of the first insulating member, the first and second insulating members are disposed in a same layer as that of the first and second insulating layers, and the auxiliary member is formed by a same process as that of the partition.

2. The display device of claim 1, wherein the first organic sealing layer is formed by being interrupted by the first insulating member, and the second organic sealing layer is formed by being interrupted by the second insulating member and the auxiliary member.

3. The display device of claim 2, wherein peripheral portions of the first and second inorganic sealing layers are removed using the second organic sealing layer as a mask.

4. The display device of claim 1, wherein the auxiliary member is formed by a same process as that of the partition.

5. The display device of claim 4, wherein the partition and the auxiliary member have a shape in which a width of an upper portion is greater than a width of a lower portion.

6. The display device of claim 1, wherein the display element includes:

a first electrode disposed on the first insulating layer which overlaps the respective pixel;

an organic layer in contact with the first electrode via the opening portion; and a second electrode disposed on the organic layer, and the second electrode which overlaps a first pixel is connected to the second electrode which overlaps a second pixel adjacent to the first pixel via an auxiliary wiring line disposed between the second insulating layer and the partition.

* * * * *